United States Patent [19]

Kumar et al.

[11] Patent Number: 5,290,732
[45] Date of Patent: Mar. 1, 1994

[54] PROCESS FOR MAKING SEMICONDUCTOR ELECTRODE BUMPS BY METAL CLUSTER ION DEPOSITION AND ETCHING

[75] Inventors: Nalin Kumar, Austin; Chenggang Xie, Cedar Park; Rama R. Goruganthu, Austin, all of Tex.; Mohammed K. Ghazi, Newport Beach, Calif.

[73] Assignees: Microelectronics And Computer Technology Corporation, Austin, Tex.; Hughes Aircraft Company, Los Angeles, Calif.

[21] Appl. No.: 896,126

[22] Filed: Jun. 9, 1992

Related U.S. Application Data

[63] Continuation-in-part of Ser. No. 653,609, Feb. 11, 1991, Pat. No. 5,156,997, and a continuation-in-part of PCT/US92/01148.

[51] Int. Cl.$^5$ .................................................. H01L 21/285
[52] U.S. Cl. ...................................... 437/183; 437/196; 437/930
[58] Field of Search ............... 437/183, 196, 202, 247, 437/930; 204/191.11, 298.04

[56] References Cited

U.S. PATENT DOCUMENTS

| | | | |
|---|---|---|---|
| Re. 3,3193 | 4/1990 | Yamaguchi et al. | 250/309 |
| 3,986,255 | 10/1976 | Mandal | 29/626 |
| 4,005,472 | 1/1977 | Harris et al. | 357/61 |
| 4,042,954 | 8/1977 | Harris | 357/71 |
| 4,082,636 | 4/1978 | Takagi et al. | 204/192 N |
| 4,091,138 | 5/1978 | Takagi et al. | 428/209 |
| 4,125,441 | 11/1978 | Dugan | 204/12 |
| 4,139,434 | 2/1979 | Dugan | 204/129.35 |
| 4,141,782 | 2/1979 | Dugan et al. | 156/643 |
| 4,152,478 | 5/1979 | Takagi | 428/221 |
| 4,556,798 | 12/1985 | McKenna et al. | 250/492.2 |
| 4,600,600 | 7/1986 | Pammer et al. | 427/89 |
| 4,609,809 | 9/1986 | Yamaguchi et al. | 219/121 |
| 4,639,301 | 1/1987 | Doherty et al. | 204/192.31 |
| 4,714,517 | 12/1987 | Malladi et al. | 156/629 |
| 4,750,666 | 6/1988 | Neugebauer et al. | 228/160 |
| 4,786,545 | 11/1988 | Sakuma et al. | 428/209 |
| 4,868,068 | 9/1989 | Yamaguchi et al. | 437/195 |
| 4,875,617 | 10/1989 | Citowsky | 228/123 |
| 4,876,112 | 10/1989 | Kaito et al. | 437/930 |
| 4,880,708 | 11/1989 | Sharma et al. | 428/620 |
| 5,098,737 | 3/1992 | Collins et al. | 427/53.1 |
| 5,196,102 | 3/1993 | Kumar | 427/528 |

FOREIGN PATENT DOCUMENTS

| | | | |
|---|---|---|---|
| 58-87848 | 5/1983 | Japan | 437/930 |
| 63-76332 | 4/1988 | Japan | 437/930 |

OTHER PUBLICATIONS

P. A. Totta et al, "SLT Device Metallurgy and its Monolithic Extension," *IBM Journal of Research Development*, May, 1969, pp. 226–238.

C. D. Cruz et al, "Ion Cluster Emission and Deposition From Liquid Gold Ion Sources," *Journal of Applied Physics*, vol. 58(7), Oct. 1, 1985, pp. 2724–2730.

K. Hatada et al, "New Film Carrier Assembly Technology: Transferred Bump TAB," *IEEE Transactions on Components, Hybrids, and Manufacturing Technology*, vol. CHMT-10, No. 3, Sep. 1987, pp. 335–340.

*Primary Examiner*—Olik Chaudhuri
*Assistant Examiner*—David E. Graybill
*Attorney, Agent, or Firm*—David M. Sigmond

[57] ABSTRACT

Ionized metal cluster beam deposition of metal bumps on substrates such as multi-chip modules and integrated circuit chips is enhanced. The present invention discloses wet etching techniques for removing unwanted metal deposited on the substrate around bumps, and multiple sources for depositing alloyed (tin-lead) bumps with constant composition.

29 Claims, 11 Drawing Sheets

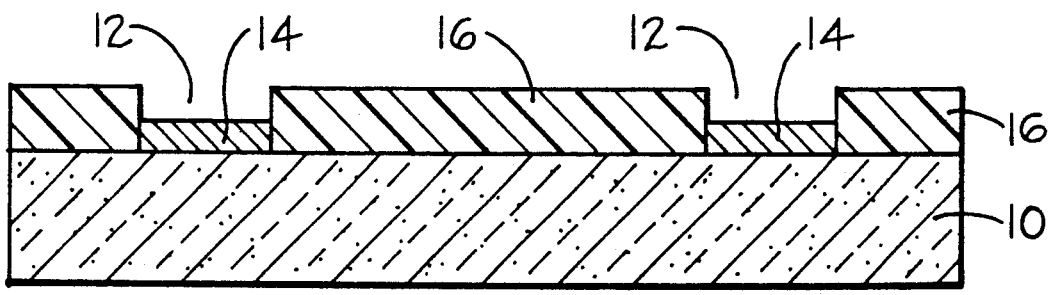
Fig. 1 PRIOR ART
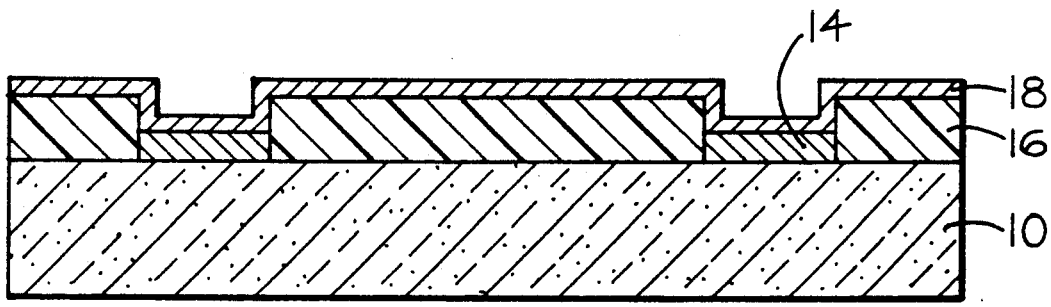
Fig. 2
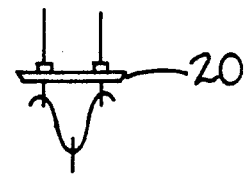
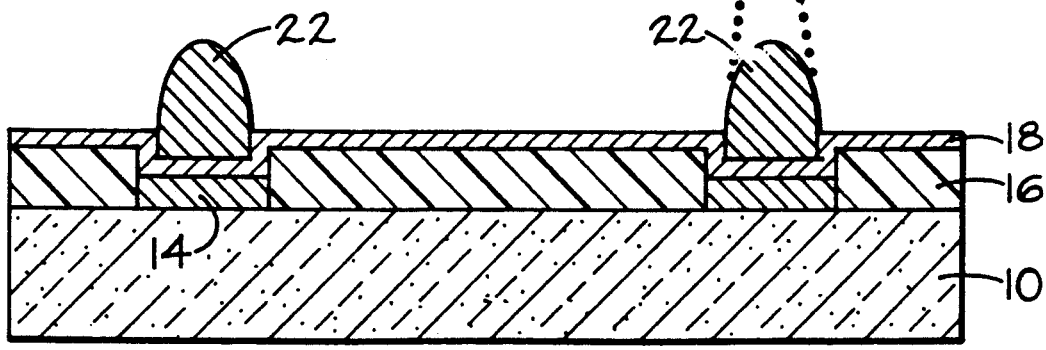
Fig. 3

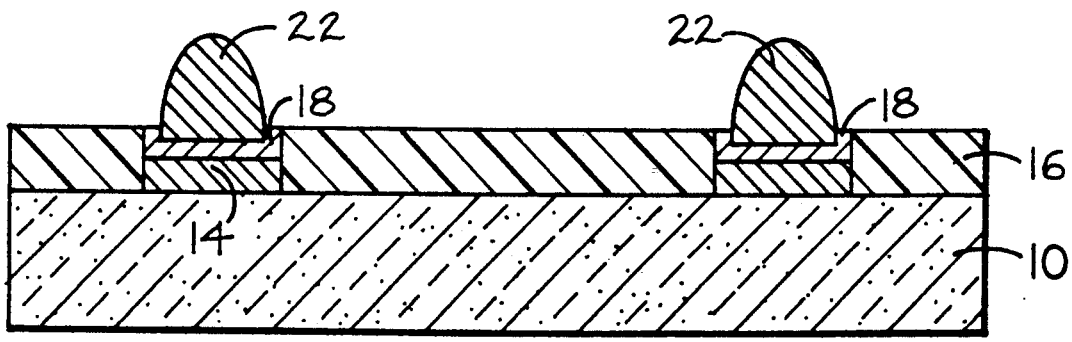
Fig. 4
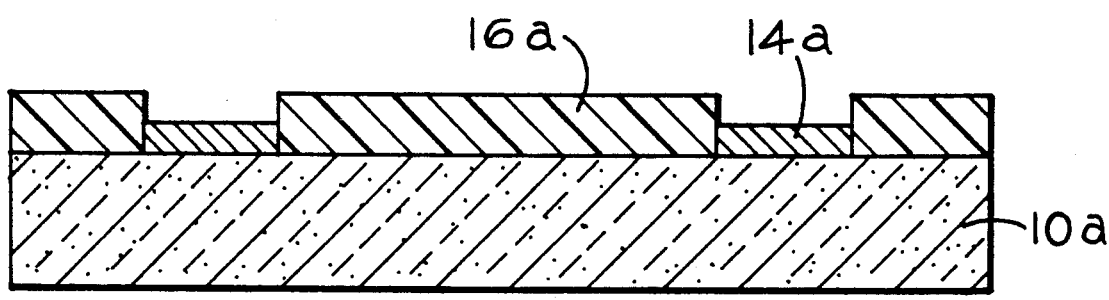
Fig. 5
Fig. 6
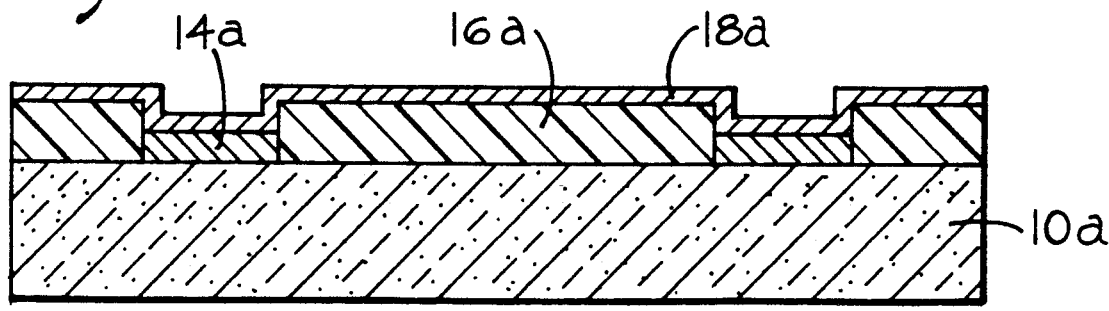

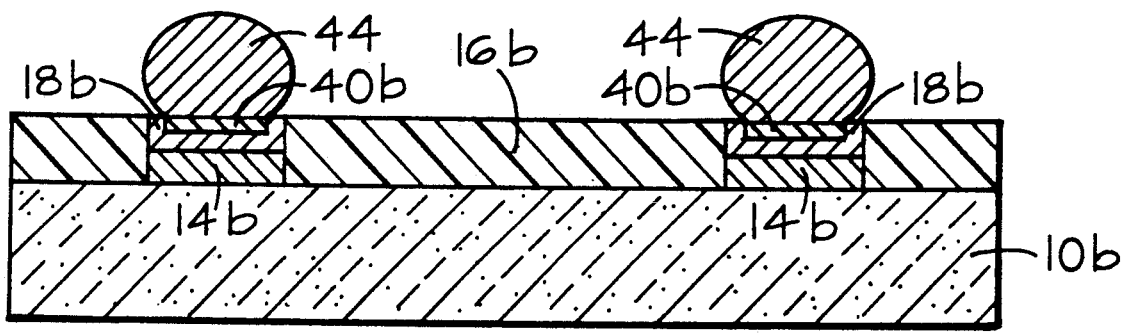
Fig. 10
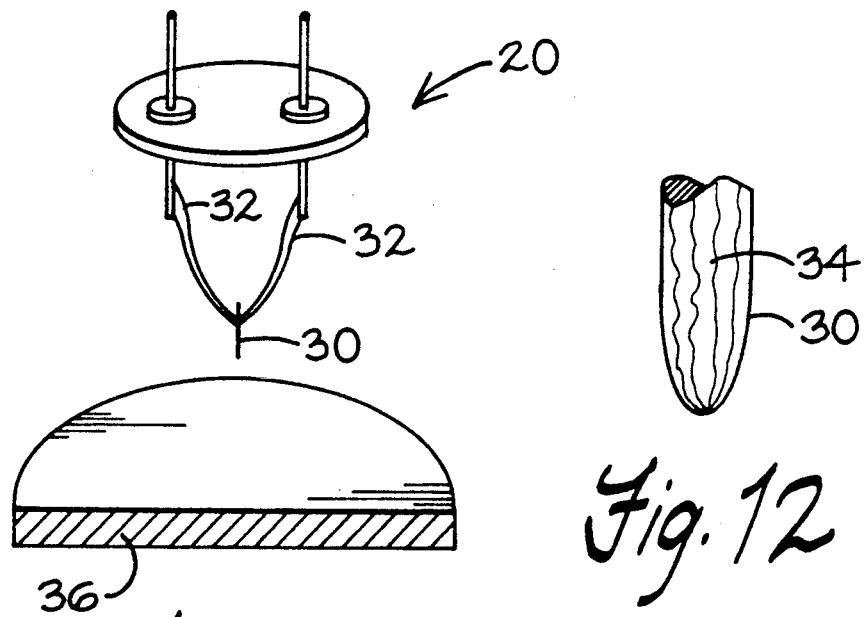
Fig. 11
Fig. 12

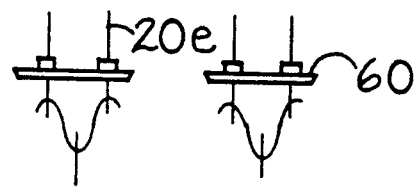 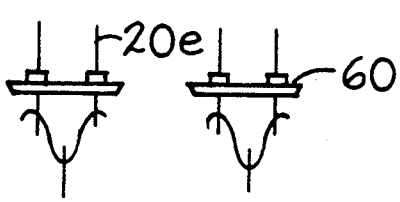
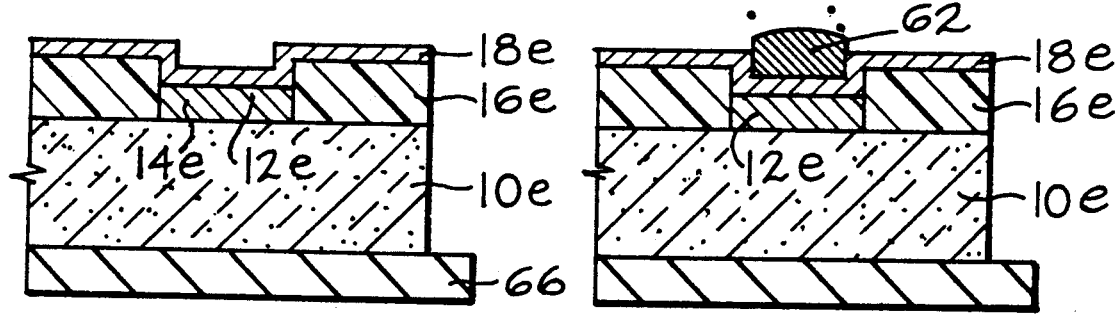
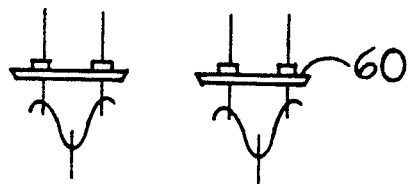 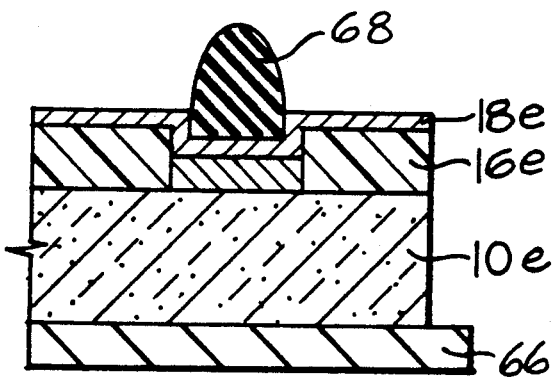
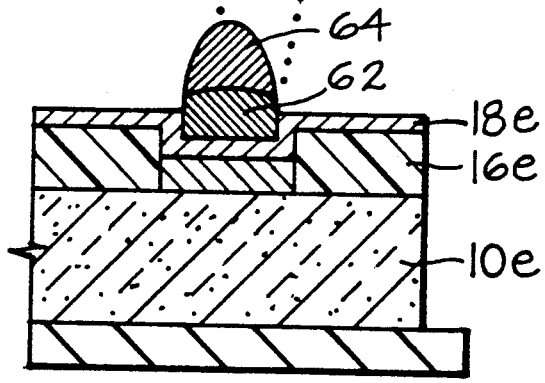

PROCESS FOR MAKING SEMICONDUCTOR ELECTRODE BUMPS BY METAL CLUSTER ION DEPOSITION AND ETCHING

CROSS-REFERENCE TO RELATED APPLICATIONS

This is a continuation-in-part of U.S. application Ser. No. 07/653,609, filed Feb. 11, 1991, now U.S. Pat. No. 5,156,997; and a continuation-in-part of International application Ser. No. PCT/US 92/01148 filed Feb. 10, 1992.

BACKGROUND OF THE INVENTION

1. Field of the Invention

The present method is directed to systems and methods for using ionized metal cluster beams and, more particularly, to depositing metal bumps on electrical substrates and removing undesired deposits around the bumps, to depositing alloyed bumps with constant compositions, and to cleaning metal out of focusing apertures.

2. Description of the Related Art

Recently, most of the high performance electronic systems demand that either tape-automated-bonding (TAB) or flip chip bonding be used as compared to wire bonding to attach integrated circuit chip leads to high density interconnect boards. These types of bonding require that the chip interconnect pads be higher than the rest of the chip. Preferably, such pads are metal bumps anywhere between 1 and 20 microns thicker than 1 micron thick aluminum typically required for wire bonding.

However, chips normally have only thin metal pads for wire bonding and are not available with thick bumps. Thick bumps can be manufactured by the time-consuming process of photolithography using either a bump plating process or lift-off process.

Needless to say, there is a need for systems and methods designed to rapidly and reliably manufacture thick metallic bumps (such as of gold and tin-lead alloys) on chips and other substrates in microelectronic applications.

SUMMARY

The present invention is directed to a method of making electrical connection bumps on pad areas of an electrical substrate, characterized by depositing metallic bumps on the pad areas by ionized metal cluster deposition.

Preferably, the deposited metallic bumps are (i) fabricated with a direct metal writing tool such as a focused liquid metal cluster beam; (ii) are selected from the group consisting of gold, indium, lead, tin, solder, copper, nickel and aluminum; (iii) are approximately between 1 and 20 microns thick; (iv) have an aspect ratio of approximately one; and (v) are thicker than the thickness of the pads on the substrate's surface.

One embodiment includes a method of making electrical connection bumps on pad areas of an electrical substrate by depositing a layer of a metallic adhesion material over the surface of the substrate including the pad areas, depositing metallic bumps over the pad areas by a focused cluster beam, and etching the layer of metallic adhesion material off the surface of the substrate outside the deposited bumps.

Another embodiment includes depositing an additional second metallic bump on each first metallic bump. Preferably, the second metallic bumps are selected from the group consisting of lead, tin, nickel and gold; have a thickness greater than the thickness of the first metallic bump thereby speeding up the process of fabricating bumps; and are formed by either electroless plating or by dipping the first bumps into a solder dip such as a low melting temperature metallic alloy.

A still further embodiment includes depositing a layer of a metallic adhesion material over the surface of a chip including the pads, depositing a metallic bump over each of the pads using a liquid metal source that generates a focused metal cluster beam which impinges the pads, and chemically etching the layer of metallic material off the surface of the chip outside the deposited bumps. Preferably, the metallic bumps are deposited while moving the chip relative to the focused spot of the cluster source in order to scan the pad areas. Prior to depositing the metal adhesion material, any passivation layer is removed from the pads by a plasma etch, chemical etch, or combination of the two.

Another object of the present invention is to remove unwanted metal deposits on the chip or substrate outside or around the bumps which may short adjacent bumps, and to do so without destroying (or in some embodiments without appreciably affecting) the bumps.

A further object of the present invention is to deposit alloyed metal bumps with constant composition using ionized metal cluster beam deposition.

A still further object of the present invention is to remove metal deposited by an ionized metal cluster beam in a focusing aperture by using an ion beam generated by the same or a different source than the cluster beam source.

Other and further objects, features and advantages will be apparent from the following description of presently preferred embodiments of the invention, given for the purpose of disclosure, and taken in conjunction with the accompanying drawings.

BRIEF DESCRIPTION OF THE DRAWINGS

FIGS. 1-4 are schematic sectional views illustrating sequential steps of one method of fabricating bonding bumps on an electrical chip, FIGS. 5-9 are schematic sectional views illustrating sequential steps of another method of manufacturing bumps on an electrical chip, FIG. 10 is a schematic sectional view of one step in the manufacture of a bump on a chip which can be substituted for FIG. 9, FIG. 11 is a schematic perspective elevational view of a liquid metal ion source suitable for the fabrication a bump in the present invention, FIG. 12 is an enlarged view of the needle in FIG. 11, FIGS. 13-15 are schematic sectional views illustrating sequential steps of one method for preventing shorts between adjacent bumps.

DESCRIPTION OF THE PREFERRED EMBODIMENTS

Figure 7:
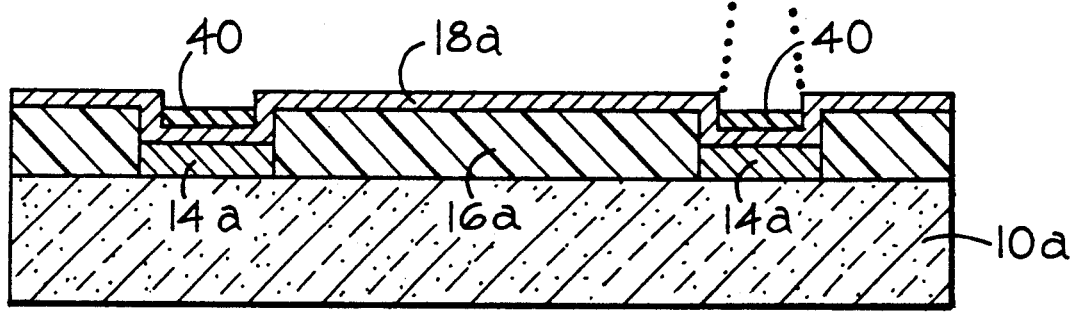

Referring now to the drawings, and particularly to FIG. 1, the reference numeral 10 generally indicates an electrical substrate such as a semiconductor chip having a plurality of pad areas 12, or as is conventional, aluminum metal pads 14 thereon to provide electrical connections to be bonded to interconnect boards such as using TAB or flip chip technology. Normally, the aluminum pads 14 would be relatively thin, such as one micron thick which, while suitable for wire bonding, would not provide suitable chip interconnect pads for TAB or flip chip bonding. In addition, the chip 10 may include a passivation layer 16 extending above the top of the chip. Thus, the structure shown in FIG. 1 is conventional.

Referring now to FIG. 2, in the process of fabricating chip interconnect bonding bumps, a first layer or plurality of layers 18 of an adhesion/barrier material is either sputtered or evaporated, by conventional methods, on the bare chip 10. If a passivation layer 16 covers the pads 14, the passivation layer must be removed from the pads 14 prior to this step.

Depending upon the pad metallurgy and the type of chip 10, the material used for layer 18 could be chromium, titanium, titanium-tungsten alloy, nickel or a combination of two or more of the above materials. The material may also be a compound such as titanium nitride, tantalum nitride, hafnium nitride, zirconium nitride, and titanium-tungsten nitride where the compound is either used alone or in conjunction with one or more of the aforementioned metals listed above. In the preferred embodiment, the layer 18 may be 500 angstroms of titanium applied by sputtering.

The purpose of the metallic adhesion layer 18 is several-fold. First, the layer 18 essentially provides an electrical short for all of the pads 14 on the chip 10 so that the high energy beam of charged ions and clusters to be applied later does not destroy the delicate devices in the chip due to electrical charge build up. Secondly, the layer 18 acts as an adhesion layer between the chip pad metal 14 (usually aluminum) and the bump metal to be applied, such as gold or solder. Thirdly, the layer 18 helps to spread the heat of the cluster beam to be applied over a large area so as to avoid the formation of hot spots under the pads 14. Fourthly, the pads 14, which are normally aluminum, have a thin native oxide layer on their surface. This oxide affects the adhesion to the pads 14. For example, solder cannot be plated directly on aluminum pads 14. Furthermore, bumps cannot be fabricated by dipping aluminum pads 14 in solder. Fifthly, the layer 18 acts as a diffusion barrier between the pads and the bump metal to be applied. The net effect of the layer 18 is to provide a surface on the pads 14 which will allow the deposition of bumps thereon which results in a very low contact resistance which is particularly important in very small bumps.

While a layer 18 is applied in the illustration set forth, it is understood that with certain other chips or substrates 10 it may be possible to perform the present invention without the need for a layer 18. That is, the metallic bumps can in some instances be deposited directly on the pads by a metal cluster ion beam without applying and etching layer 18. While this reduces the processing steps, the forementioned advantages of applying layer 18 are lost.

Referring now to FIG. 3, an ionized metal cluster source depicted, for illustration purposes only, as a focused liquid metal cluster source direct write tool 20, which will be described more fully hereinafter, is provided to deposit metallic bumps over the pad areas or pads 14 by a focused cluster beam. Preferably, the metallic material for the bumps is selected from the group consisting of gold, indium, lead, tin, solder, copper, nickel and aluminum with gold being the preferred material. The direct write tool 20 provides a method of making the necessary thicker bumps 22 for use as a chip interconnect bonding bump which is particularly useful for TAB or flip chip bonding. For example, the bumps 22 may be made between 1 and 20 microns thick, or thicker if required. In addition, the bumps 22 can be made with an aspect ratio of approximately 1. The bumps 22 can be made by moving the direct write tool 20 relative to the chip 10, but it is preferable to move the chip 10 in the X-Y horizontal directions while the tool 20 is stationary. In some cases, once chip 10 has been moved under a focused beam spot from direct write tool 20, the beam may be dithered by electrical deflection to make the bumps 22 larger than the beam spot.

The commercial viability of a direct write tool 20 is determined by its throughput. A capillary type source with a total throughput of $10^5$ cubic microns/second will be able to write one $100 \times 100 \times 10$ micron bump per second. This means that a 200 pad chip 10 can be bumped in less than four minutes. Actually, the throughput increases when the bump dimensions are decreased as is the recent trend for VLSI chips. For very small bumps (it will be easy to make one mil bumps), a needle type source (throughput of 1000 cubic microns/second) will be used.

As shown in FIG. 4, after depositing the bumps 22 over the pad areas or pads 14, to the proper dimensions, the metallic adhesion layer 18 is etched off such as in a suitable wet chemical etching solution. For example, in the case of a layer 18 of titanium, a wet chemical etch of hydrofluoric acid can be used. This results in removal of all of the metal layer 18 except under the bumps 22. Due to the very small thickness of the layer 18, the undercut under the bumps 22 is neglibible.

The direct writing tool 20 may be any suitable liquid metal source, for instance by depositing a focused cluster beam as disclosed in C. D. Cruz and K. Pourrezaei, "Ion Cluster Emission and Deposition From Liquid Gold Ion Sources," *Journal of Applied Physics*, Vol. 58(7), Oct. 1, 1985, pp. 2724-2730. The disclosure for this article is hereby incorporated in its entirety by reference.

It is understood, however, that the present invention may use an unfocused liquid metal cluster beam to fabricate the bumps. This can be done by bringing an electrical substrate in very close proximity, e.g. less than 1 millimeter, to the liquid metal source tip so that the deposited spot is smaller than the desired size of the bump.

In other related art, U.S. Pat. No. 5,196,102, for instance, discloses a method of applying a compound of a metal and a reactive gas onto a surface by depositing a metal from a liquid metal cluster ion source onto the surface in the presence of a gas on the surface to combine with the deposited metal while isolating the gas from the source of the metal cluster ions. As best seen in FIGS. 11 and 12, the direct right tool 20 may consist of a sharpened 380 micron straight tungsten wire 30 spot welded between a pair of tungsten wire loops 32. The surface of the tungsten needle 30 is made to have grooves 34 in its outer surface and the needle is coated with a suitable metallic bump material such as gold. When the needle 30 is resistively heated until the gold is molten and a positive potential of approximately ten kilovolts (kV) dc with respect to the extractor 36 is applied, intense ionization of the molten gold at the tip of the needle 30 occurs. Thus, a source for the cluster beam is provided for laying down metallic bumps on a chip 10.

As described in connection with the method of FIGS. 1–4, it is estimated that a 200 pad chip 10 can be provided with bumps 22 of a size of 100×100×10 microns in four minutes. However, in order to provide bumps of the required thickness in less time, the method described in FIGS. 5–9 may be utilized wherein like elements are similarly numbered with the addition of the suffix "a" and any previous description is incorporated insofar as the same is applicable.

FIG. 5 shows a chip 10a as the starting chip, which is identical to that shown in FIG. 1 having pad areas or aluminum pads 14a and an optional passivation layer 16a over the upper surface of the chip 10a excluding the pads 14a. In FIG. 6, an adhesion/barrier layer 18a which may be identical to layer 18 of FIG. 2 is provided with the preferred embodiment being 500 angstroms of titanium which is conventionally sputtered over the top surface of the pad 10a.

And in FIG. 7, metallic first bumps 40 are deposited over the pad areas or pads 14a. While the bumps 40 may be of any suitable material such as gold, indium, lead, tin, solder, copper, nickel and aluminum, the preference is gold. However, the first metallic bumps 40 are deposited in a thin form in order to speed up the fabrication of bumps. That is, the first metallic bumps 40, for example only, may be 500 angstroms thick of gold which are formed as in FIG. 3 by depositing the bumps 40 by a focused cluster beam. Because of the thinness of the first metallic bumps 40, they can be quickly fabricated over all of the pads 14a.

Figure 8:
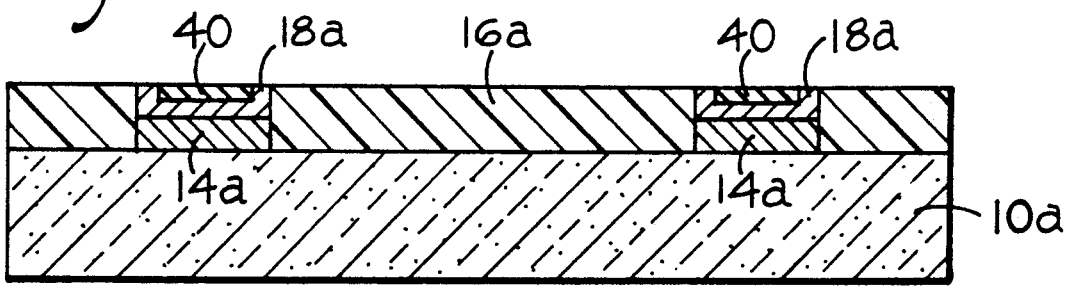

The next step, in FIG. 8, is the removal of the layer of metallic adhesion material 18a off of the surface of the chip 10a outside of the deposited first metallic bumps 40.

Figure 9:
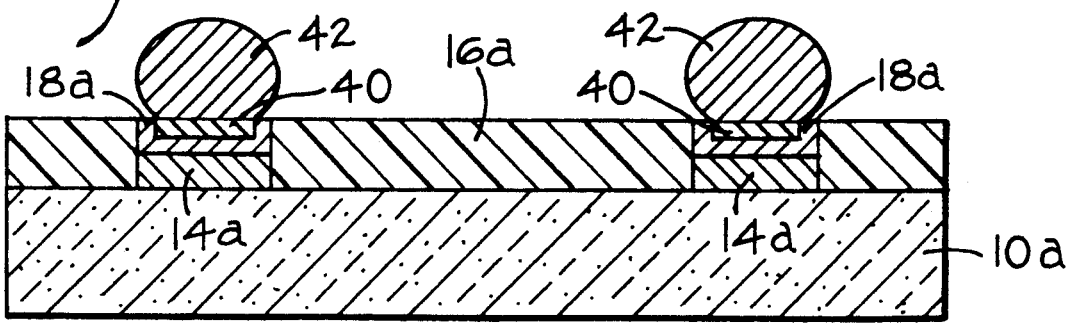

Referring now to FIG. 9, a second metallic bump 42 may be applied to each of the first metallic bumps 40 by a faster process than the direct write tool using a liquid metal source in the step described in FIG. 8. For example, the second metallic bumps 42 can be applied to the first bumps 40 by a conventional electroless plating process using any suitable metal such as gold, tin, or lead. Therefore, the process of FIGS. 5–9 provides a larger throughput of fabricated bumps than the process described in FIGS. 1–4. However, the electroless plating process of FIGS. 5–9 may degrade certain chips and thus be unacceptable.

Referring now to FIG. 10, a further method of producing the second bumps is provided. In FIG. 10, the method shown can be substituted for the step shown in FIG. 9. That is, a chip 10b is provided which is the same as the structure in FIG. 8 wherein like elements are similarly numbered with the addition of the suffix "b" and any previous description is incorporated insofar as the same is applicable. However, in FIG. 10 the second bumps 44 are deposited onto the first bumps 40b by a conventional solder dip process. That is, the first metallic bumps 40b are dipped into a suitable lead-tin solder dip. Any suitable solder having a low melting temperature metallic alloy is suitable. For example, another suitable solder dip would be an alloy of indium-bismuth-tin.

In any event, the final steps of FIGS. 9 and 10 are advantageous in speeding up the process of fabricating bumps in that the first bumps 40 and 40b apply a metallic layer, such as gold, which provides a base for the additional second metallic bumps 42 and 44 in FIGS. 9 and 10, respectively, which can be more quickly applied. It is to be noted that the steps in FIGS. 8–10 are additionally speeded up by the fact that the first metallic bumps 40 and 40b are thinner than the second metallic bumps 42 and 44, respectively. That is, the materials which have a slower application in first metallic bumps 40 and 40b are thinner, while the more quickly applied second metallic bumps 42 and 44 are thicker to provide the composite required thickness. Furthermore, since solder bumps can not normally be dipped directly on pads 14, the use of metal cluster deposition to form metal bumps 40 and 40b on pads 14 becomes essential for providing compatibility with solder dipping.

In performing the ionized metal cluster beam deposition of the present invention, it is possible that a very thin layer (e.g., a few ten to a few hundred angstroms thick) of the source metal may be deposited around the bumps for several reasons. Ionized metal cluster emissions tend to have gaussian distributions. Factors which influence such gaussian distributions include the sputtering effect of the cluster beam, the limitation of the beam lens column, the source metal, the energy spread of the clusters, and the species of particles (single ions, multiple ions or metal clusters) in the beam. This gaussian characteristic may cause a thin metal layer to be deposited outside the bumps. Furthermore, when the bumps are closely spaced, the thin layer may extend to adjacent bumps (or a similar thin layer surrounding adjacent bumps). For example, with bumps 20 microns wide and 20 microns apart the possibility of shorting the bumps becomes acute. This might force a sharp increase in the minimum acceptable bump pitch, which is highly undesirable in high density microelectronic applications. To overcome this problem, the present invention includes several etch-back processes to prevent such a thin layer from shorting closely spaced bumps.

Figure 13:
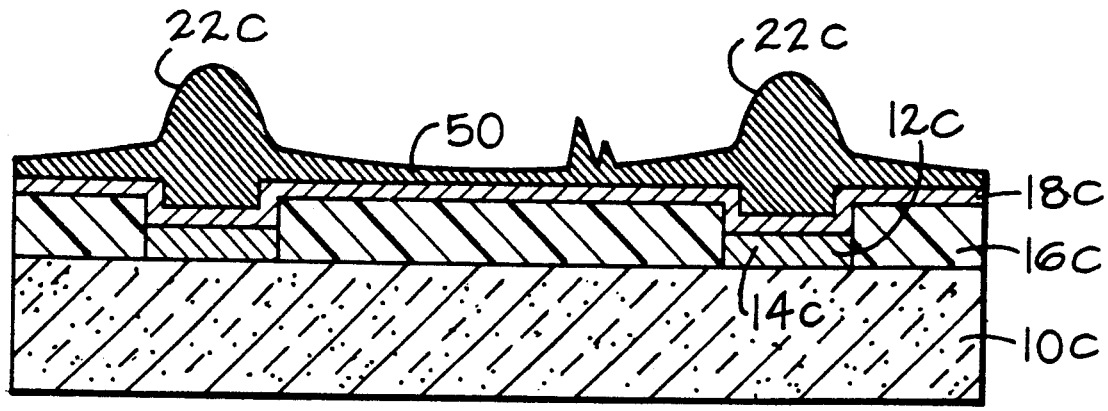
Figure 14:
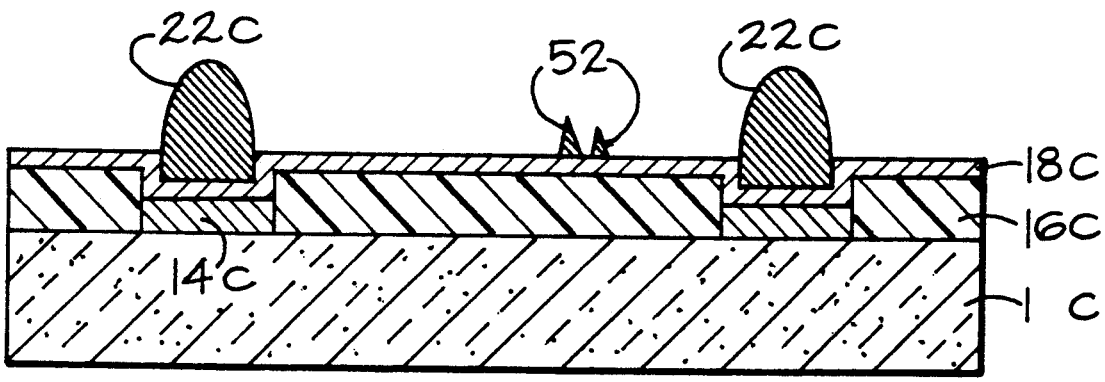
Figure 15:
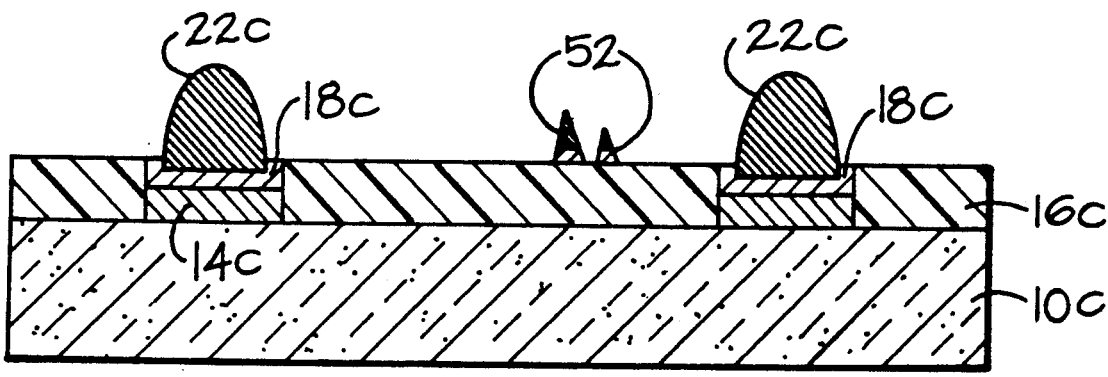

A first etch-back process for preventing such unwanted shorts is provided in FIGS. 13–15 wherein like elements are similarly numbered with the suffix "c" and any previous description is incorporated insofar as the same is applicable.

Referring now to FIG. 13, chip 10c includes pad areas 12c shown as aluminum pads 14c, passivating layer 16c between and above pads 14c, metallic adhesion layer 18c on pads 14c and passivation 16c, metallic bumps 22c deposited on pad areas 12c by cluster beam deposition, and a thin, unwanted, metal layer 50 deposited outside bumps 22c during the cluster beam deposition of bumps 22c. Metal layer 50 is seen to form a continuous metal link that shorts the adjacent bumps 22c. Furthermore, metal 50 is likely to be highly resistant to whatever etch is needed to remove adhesion layer 18c. Therefore, proceeding directly to the adhesion metal etch step would fail to remove layer 50 and only remove the exposed (uncovered) adhesion metal 18c, which may be little or none.

With reference now to FIG. 14, before adhesion layer 18c is etched a separate etch is provided to remove enough metal from bumps 22 and layer 50 to prevent layer 50 from connecting bumps 22c, yet fail to remove so much metal that bumps 22c are virtually or completely eliminated. While some portion of bumps 22c must be removed, it is essential that bumps 22c are only partially removed. Preferably, essentially all of layer 50 is removed while only one percent to ten percent of the thickness of bumps 22c is removed. The gaussian distribution of the deposited metal should make this possible in the presence of a suitable wet chemical etchant. Although fragments 52 of layer 50 may remain on substrate 10c after etching occurs, such fragments fail to form a continuous short-circuit path between bumps 22c.

Referring now to FIG. 15, a separate wet chemical etch is applied to remove metallic adhesion layer 18c outside bumps 22c and metal fragments 52 without appreciably affecting bumps 22c.

EXAMPLE 1

A substrate of 2500 angstroms chromium on a silicon wafer was provided. A gold seed layer was deposited on the chromium by a focused, ionized, liquid metal cluster beam source with a 12 kV beam energy and a 6.8 kV focusing voltage.

A 10 second per bump deposition time was used with 500 micron bump spacing to produce 500 angstrom thick bumps. After deposition, the gold was etched-back in a potassium iodide solution for 2 seconds followed by a deionized water rinse. The exposed chromium was then etched in a potassium ferricyanide solution for 12 minutes followed by a deionized water rinse. The gold was then activated for nickel plating by applying a "Shipley 472" palladium chloride solution for 30 seconds. Thereafter, the substrate was placed in a Shipley 84 nickel potassium plating bath for 12 minutes to plate nickel on the gold, followed by a deionized water rinse. The resultant bumps had approximately 100 micron diameters and 3.5 micron heights. The gold did not short the bumps.

Another etch-back process for preventing unwanted shorts is provided in FIGS. 16–20 wherein like elements are similarly numbered with the suffix "d" and any previous description is incorporated insofar as the same is applicable. The previously described etch-back process in FIGS. 13–15 requires a precisely controlled etch step since too little etching leaves the shorts intact whereas too much etching destroys the bumps. The precision becomes extreme when a wet chemical etch is used to remove only a few angstroms of metal. The embodiment in FIGS. 16–20 relaxes the harsh precision needed during etching at the cost of additional processing steps.

Figure 16:
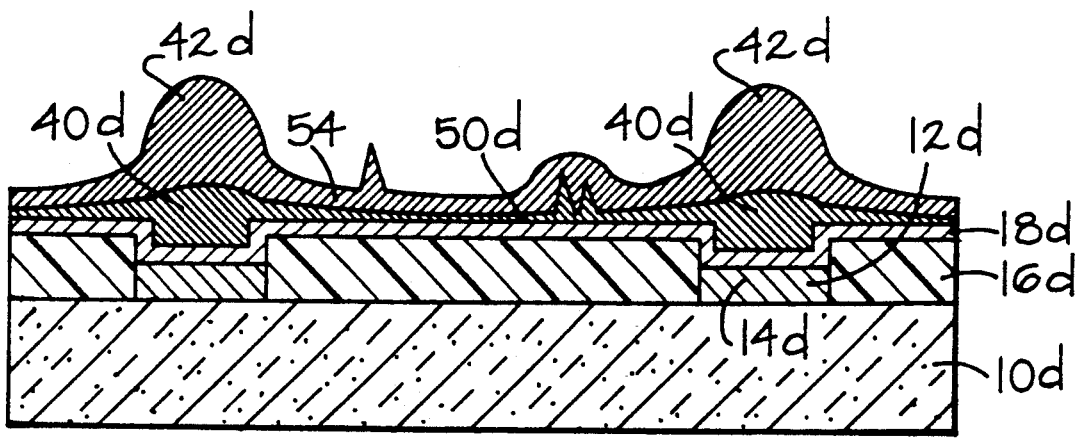
FIGS. 16-20 are schematic sectional views illustrating sequential steps of another method for preventing shorts between adjacent bumps.

With reference now to FIG. 16, chip 10d includes pad areas 12d shown as aluminum pads 14d, passivating layer 16d between and above pads 14d, metallic adhesion layer 18d on pads 14d and passivation 16d, first metallic bumps 40d deposited on pad areas 12d by cluster beam deposition, and a thin, unwanted, metal layer 50d deposited outside bumps 40d during the cluster beam deposition of bumps 40d. Metal layer 50d is seen to form a continuous metal link that shorts the adjacent bumps 40d. Then second metallic bumps 42d are deposited on bumps 40d by some conventional technique, for example by electroless plating although solder dipping is a suitable alternative. Whatever the technique, bumps 42d must at least partially cover bumps 40d. Second bumps 42d are far thicker than first bumps 40d. For instance, the thickness of bumps 42d may be 20 microns as compared to 500 angstroms for bumps 40d. In addition, an unwanted layer 54 of the second metal is deposited outside bumps 42d and forms a continuous link that shorts bumps 42d.

Figure 17:
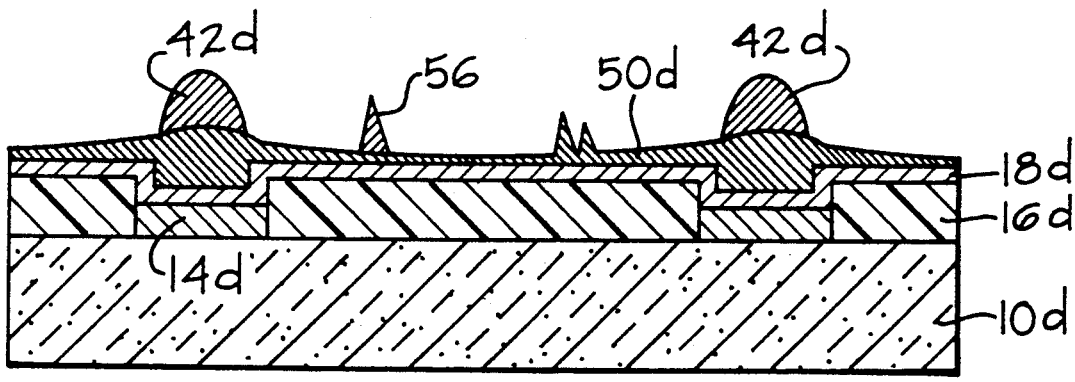

With reference now to FIG. 17, before adhesion layer 18d or layer 50d is etched, a separate etch is provided to remove enough metal from bumps 42d and layer 54 to prevent layer 54 from connecting bumps 42d without removing all of bumps 42d. That is, bumps 42d are only partially removed but enough of layer 54 is removed to assure that layer 54 can not short bumps 42d and that any portion of layer 50d which forms a continuous path between bumps 40d is at least partially exposed. Preferably, essentially all of layer 54 is removed during a wet chemical etch. Although fragments 56 of layer 54 may remain on substrate 10d, such fragments are insufficient to short bumps 42d. It should be noted that the relatively large thickness of bumps 42d allow the etching to be performed with relative ease.

Figure 18:
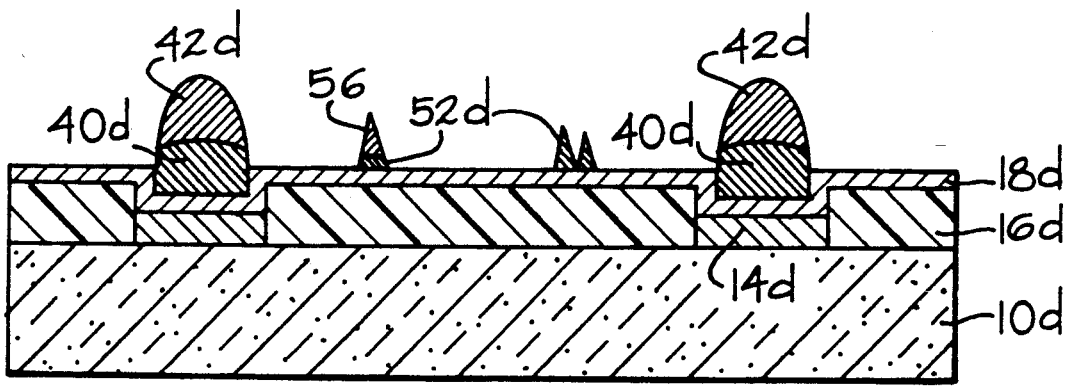

Referring now to FIG. 18, another etch is applied which attacks the exposed first metal. The preferred etch is a wet chemical etch that fails to attack the second metal. The etch is continued until essentially all the exposed first metal is removed from chip 10d. The remaining second metal provides an etch mask for the underlying first metal. That is, upper bumps 42d only protect lower bumps 40d, and upper fragments 56 only protect the lower fragments 52d. As a result, the remaining fragments 52d pose no threat of shorting bumps 40d or 42d. Furthermore, although some undercutting may occur, bumps 40d are at most only partially removed.

Figure 19:
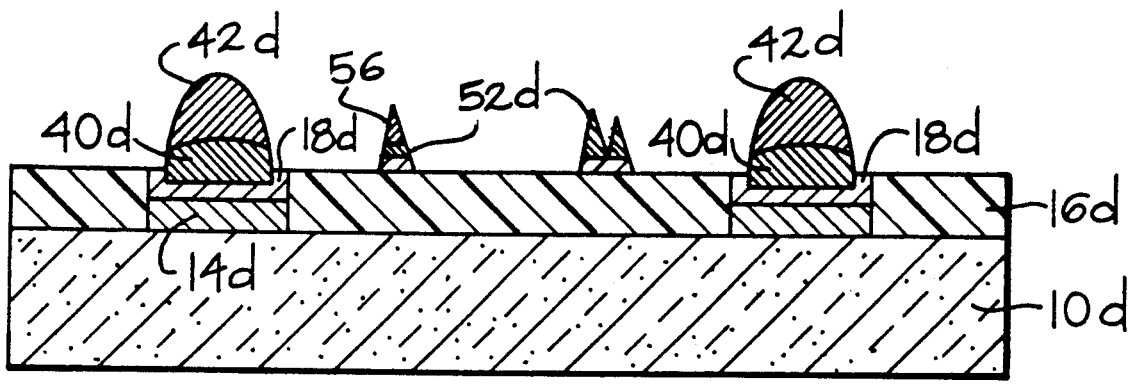

With reference now to FIG. 19, a separate wet chemical etch is applied to remove metallic adhesion layer 18d outside bumps 40d and 42d and outside fragments 52d and 56 without appreciably affecting bumps 40d or 42d.

Figure 20:
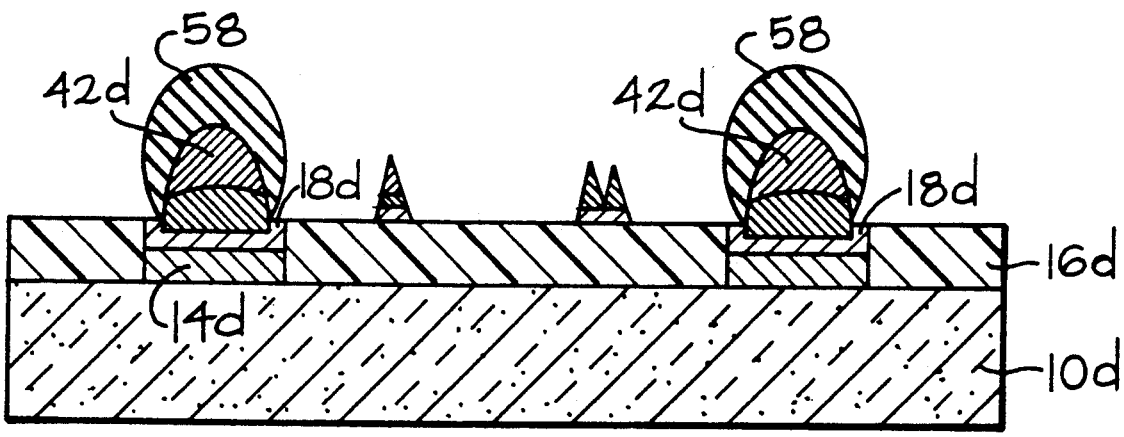

Referring now to FIG. 20, if desired, a third metal can be deposited on the second metallic bumps 42d to form third metallic bumps 58 thereon. The second and third metals may be the same, for instance electroless nickel.

EXAMPLE 2

Figure 21:
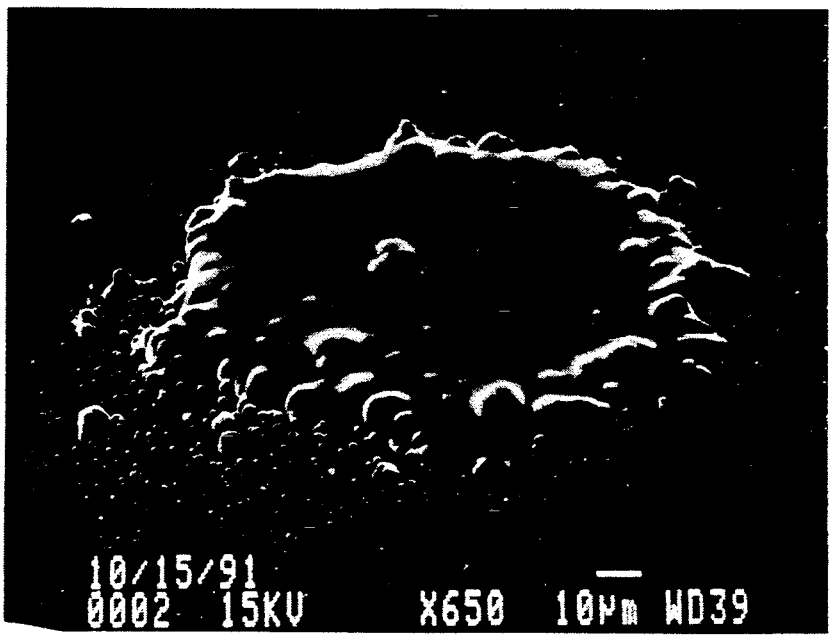
FIGS. 21-22 are photomicrographs of bumps formed at various stages of the process of FIGS. 16-20, FIGS. 23-26 are schematic sectional views illustrating sequential steps of using multiple sources for fabricating alloyed bumps.
Figure 22:
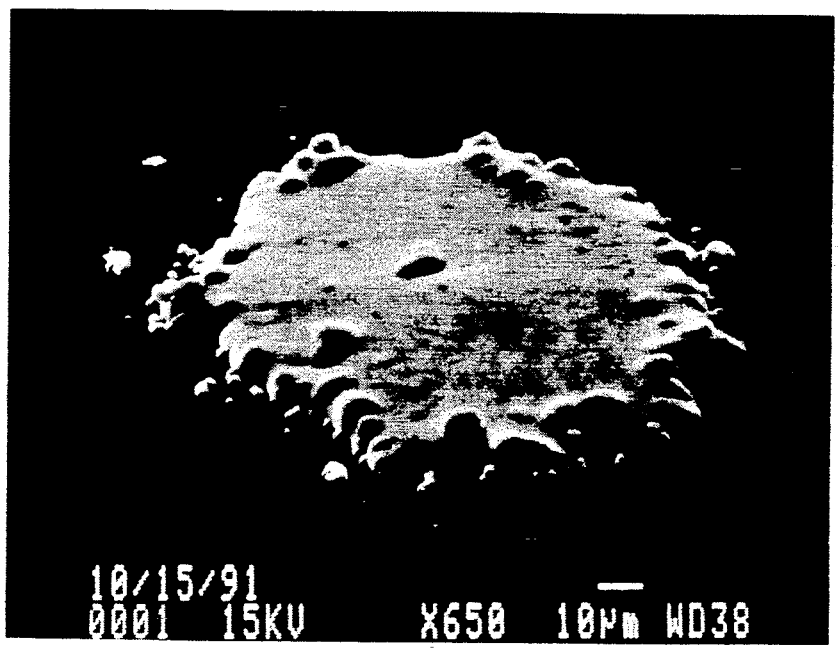

A substrate of 2500 angstroms chromium on a silicon wafer was provided. A gold seed layer was deposited on the chromium by a focused, ionized, liquid metal cluster beam source with a 12 kV beam energy and a 6.8 kV focusing voltage. A 10 second per bump deposition time was used with 500 micron bump spacing to form 500 angstrom thick gold bumps. Thereafter, the substrate was placed in a "Shipley 84" nickel potassium plating bath for 12 minutes to plate nickel on the gold at a rate of 0.33 microns per minute. A deionized water rinse was applied. A large amount of nickel was plated outside the bumps. A scanning electron microscope (SEM) photomicrograph of a resultant bump and the surrounding area is shown in FIG. 21. The bumps were then etched-back in a Patstrip #80 solution for a few seconds to reduce the thickness of the nickel by about 10 percent. Since the nickel outside the bumps was only a few percent of the thickness of the nickel bumps, essentially all of the nickel outside the bumps was removed. Another deionized water rinse was applied. A SEM photomicrograph of the same bump and surrounding area is shown in FIG. 22. Thereafter, the gold was etched-back in a potassium iodide solution for one second. This removed essentially all of the gold outside the bumps. Another deionized water rinse was applied. The exposed chromium was then etched in a potassium ferricyanide solution for 12 minutes followed by a deionized water rinse. Finally, more electroless nickel was plated on the bumps. The final height of the bumps was about 15 microns.

At times it may be desirable if not mandatory to fabricate bumps composed of an alloy material. An alloy can be used as the source material in liquid metal cluster deposition; however, various components of alloys tend to exhibit uneven field emissions. For example, in the deposition of 60–40 tin-lead alloy source material, the resultant bump tends to have a drastically different composition. The bump composition can at least initially be controlled by selecting a source material of appropriate composition. However, as the source material is depleted, different components evaporate at different rates. As a result, the composition of the source material changes and the composition of the bump changes as well. One way to prevent unequal depletion of the source material so as to maintain constant bump composition is by using a continuous loading type source. However, even with continuous loading, during cluster beam generation, different source components are likely to evaporate at different rates. The source composition may have to be precisely determined to produce the desired bump composition, adding complexity to the process. Or, if the source composition is matched to the intended bump composition, the accuracy of the resultant bump composition may be questionable. The present invention is directed to overcoming these drawbacks.

Referring now to FIGS. 23–26, a method of depositing alloyed bumps using ionized metal cluster beam deposition is now described wherein like elements are similarly numbered with the suffix "e" and any previous description is incorporated insofar as the same is applicable. As may be seen in FIG. 23, a direct write tool 20e is paired up with an identical but separate direct write tool 60. Tools 20e and 60 are aimed at aluminum pads 14e at pad areas 12e on chip 10e. In order to make alloyed bumps, tools 20e and 60 must be charged with different source materials, for example, tin and lead, respectively, although gold, indium, solder, copper, nickel and aluminum are also suitable. In FIG. 24, tool 20e deposits tin bumps 62 over pad areas 12e by cluster beam deposition. Thereafter, as seen in FIG. 25, second tool 60 deposits lead bumps 64 on tin bumps 62 by cluster beam deposition. In FIG. 26, hot plate 66 beneath chip 10e heats bumps 62 and 64 sufficiently to mix them into uniform tin-lead alloy bumps 68. Preferably, bumps 68 contain between 60 percent lead and 90 percent lead, and between 40 percent tin and 10 percent tin.

Of course, the alloyed bumps need not be limited to two starting materials. That is, a third source could deposit a third metal, a fourth source could deposit a fourth metal and so on. Then hot plate 66 could heat and melt all the metals so that a uniform four-metal alloy is formed. Furthermore, hot plate 66 could be activated during metal deposition to form the metal alloy in situ. For instance, hot plate 66 could render the deposited tin molten so that subsequently deposited lead is alloyed immediately with the molten tin. Or, hot plate 66 could be activated while the tin and lead are deposited simultaneously in order to form the alloy in situ without depositing any regions of pure tin or lead.

A problem which arises in localized ionized metal cluster beam systems is blockage of the focusing aperture (and consequently the beam) due to accumulated metal deposited in or in the way of the aperture. This obviously is a serious drawback which must be addressed. The present invention teaches several ways of overcoming this drawback.

Figure 27:
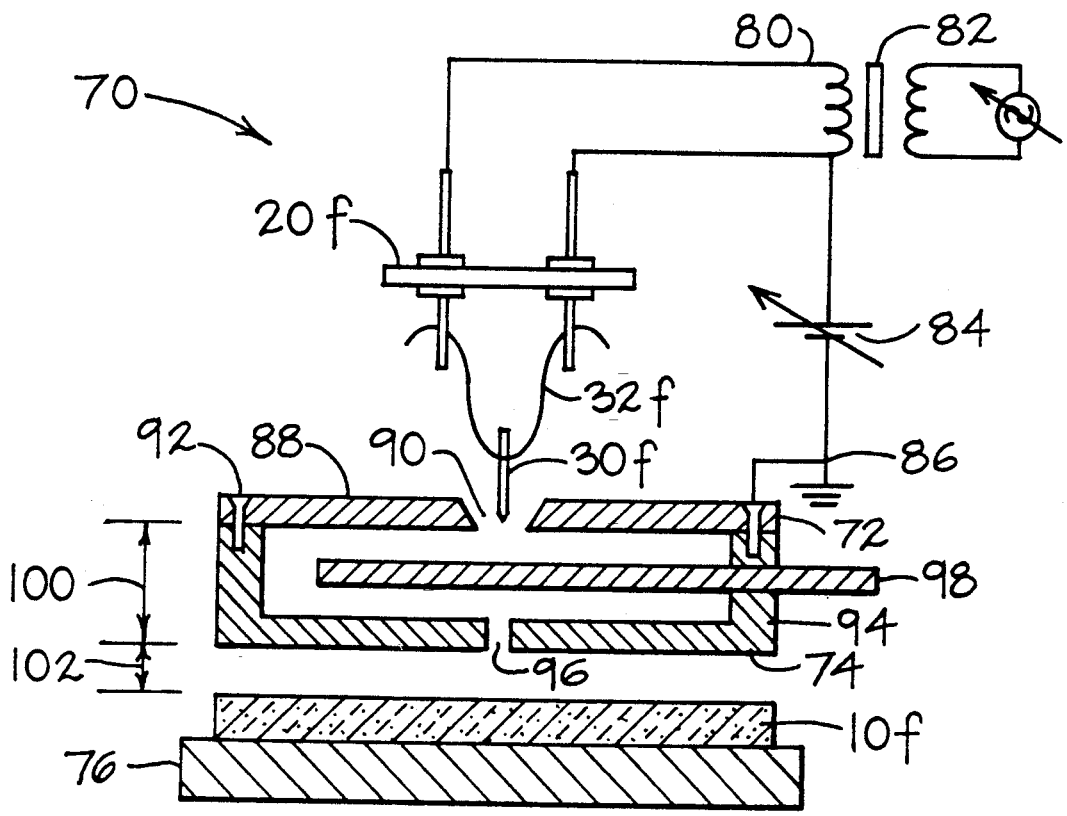
FIG. 27 is a schematic sectional view illustrating a single source for directing one of an ionized metal cluster beam through a focusing aperture for metal deposition or an ion beam at the aperture for removing deposited metal therein.
Figures 28A, 28B, 28C:
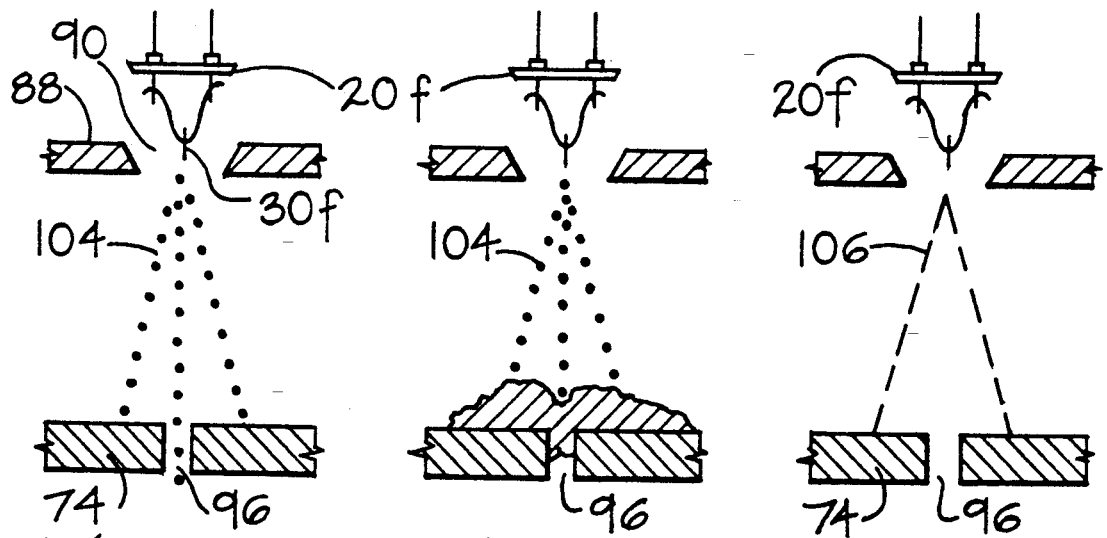
FIGS. 28A-28C are enlarged schematic sectional views illustrating the operation of the system of FIG. 27.

With reference now to FIGS. 27–28C, there is seen a system for providing a localized ionized metal cluster beam and removing metal deposited in the focusing aperture wherein like elements are similarly numbered with the addition of the suffix "f" and any previous description is incorporated insofar as the same is applicable.

Referring now to FIG. 27, system 70 includes an ionized liquid metal cluster beam source 20f, an extractor 72, an aperture holder 74 and an X-Y stage 76. Source 20f contains a conventional needle or capillary source shown as tungsten needle 30f spot welded between a pair of tungsten wire loops 32f. Wire loops 32f are connected to a variable power supply 80. Power supply 80 includes an adjustable alternating current (ac) voltage source 82 and an adjustable direct current (dc) voltage source 84. Ac source 82 is used to heat a pair of tungsten wire loops 32f to melt the source material in source 20f. Dc voltage source 84 is applied to source 20f to control whether source 20f emits a cluster beam or an ion beam. Ground 86 of supply 80 is connected to extractor 72. Extractor 72 contains a metal disk 88 with an extractor aperture 90 in close proximity to the top of needle 30f. Extractor 72 is fixedly mounted on aperture holder 74 by threaded screws 92. Aperture holder 74 includes a block-off tail or metal disk 94 with a beam defining or focusing aperture 96 therethrough. Furthermore, a thin shutter 98 can be moved in and out of the path of a cluster beam between extractor 72 and aperture holder 74 in order to blank a cluster beam, thereby acting as a "gate" or "switch." Finally, X-Y stage 76 is adapted to receive a substrate, such as a multi-chip module or integrated circuit die 10f as shown, and is laterally movable relative to the aperture holder so that a cluster beam can deposit metal on various areas of the substrate. With respect to several key dimensions, the diameter of aperture 90 is 3 millimeters, the diameter of aperture 96 is in the range of 20 millimeters to 100 millimeters and most preferably 70 millimeters, the distance 100 between the bottoms of apertures 90 and 96 is approximately 2 millimeters and preferably no greater, and the distance 102 between the bottom of aperture 96 and the top of chip 10f is approximately 0.5 millimeters. System 70 is capable of generating an ionized metal cluster beam (not shown) which, when unblocked by shutter 98, passes through aperture 96, impinges upon chip 10f and deposits metal bumps thereon.

With reference now to FIGS. 28A–28C, those skilled in the art will readily appreciate that during the operation of system 70, as seen in FIG. 28A, the source material is emitted by needle 30f through extractor aperture 90 as an unfocused, ionized, liquid metal cluster beam 104. A portion of beam 104 enters aperture 96 and passes through it and aperture holder 74 as a focused (localized) cluster beam; however, another portion of beam 104 strikes aperture holder 74 and deposits metal thereon. Inevitably, as seen in FIG. 28B, source metal is deposited on the edge and sidewalls of aperture 96 which, after sufficient time, fills or blocks some or all of aperture 96. As a result, beam 104 is either partially or totally blocked. Consequently, little or no portion of beam 104 impinges upon chip 10f.

Referring now to FIG. 28C, source 20f terminates beam 104, and thereafter, generates a separate single-ion ion beam 106 capable of etching and removing metal deposited by cluster beam 104 on aperture holder 74 in and around aperture 96. Referring back to FIG. 27, source 20f is switched from the ionized cluster emission mode to the single-ion emission mode by the lowering the voltage output of power supply 80 from 12 kV to 11 kV. This may be accomplished, for example, by decreasing dc voltage source 84 until the emission current rough wires 32f is reduced to less than 50 microamps. Referring again to FIG. 28C, ion beam 106 is directed at lower aperture 96 so that beam 106 etches and removes at least some and preferably all of the deposited metal blocking aperture 96. The etch duration depends among other factors on the metal being removed. Gold, for instance, would be easier to etch than tin or lead. With aperture 96 now "unclogged" or open, or at least not completely blocked, power supply 80 may increase the output voltage connected across wires 32f to again 12 kV by increasing dc voltage source 84 so as to convert source 20f from a ion beam source back into the initial cluster beam source. That is, source 20f is switched from the ion emission mode back to the cluster emission mode. Thereafter, as before, a portion of ionized cluster beam 104 is directed at and passes through aperture 96 as a focused cluster beam directed at chip 10f to continue metal deposition thereon.

Although not shown, a programmable computer may coordinate the emissions of source 20f with the movements of X-Y stage 76 and shutter 98. Initially, the cluster beam is directed at a first pad area of chip 10f. After a metal bump is fully deposited on the first pad area, the computer commands shutter 98 to slide into in the path of the beam. The computer then commands X-Y stage 76 to position another pad area on chip 10f directly beneath the path of the beam. While the X-Y stage is moving to reposition the chip, the computer may simultaneously switch power source 80 to the second (lower) voltage to generate the ion beam which cleans metal out of aperture 96. As X-Y stage 76 reaches its new position, aperture 96 is unclogged. Accordingly, the computer switches power source 80 to the first (higher) voltage so as to once again to emit the cluster beam from source 20f. The computer then retracts shutter 98 so that the cluster beam passes uninterruptedly through aperture 96 to impinge upon the newly positioned pad area of chip 10f therebeneath. This sequence may be repeated until metal bumps are selectively deposited by the cluster beam on all desired pad areas of chip 10f.

In some applications the throughput of system 70 may be too slow since single source 20f is used for etching as well as for metal deposition. For instance, in the previous example, the chip might be repositioned before the etching operation is finished. A delay would ensue until the aperture was cleaned, the beam was switched from an ion beam to a cluster beam, and the shutter was opened. Nevertheless, with the inclusion of additional equipment, the aperture cleaning of the present invention can be performed more rapidly and without significantly reducing system throughput.

Figure 29:
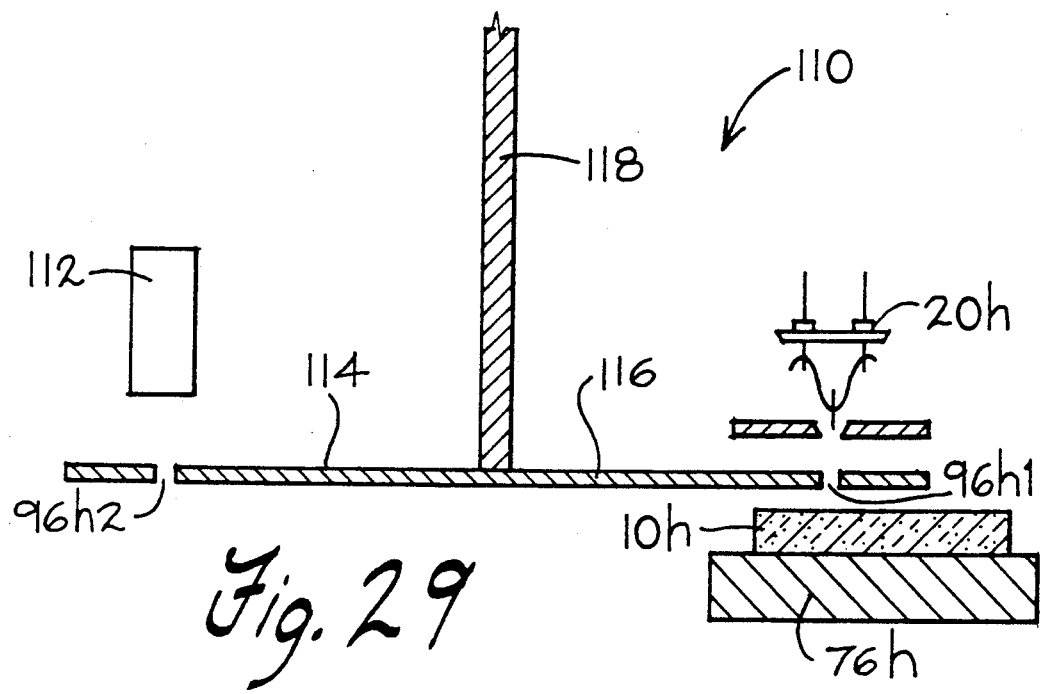
FIG. 29 is a schematic sectional view illustrating a system for directing a cluster beam through a first focusing aperture for metal deposition and an ion beam at a second focusing aperture for removing deposited metal in the second aperture.
Figures 30A, 30B, 30C, 30D:
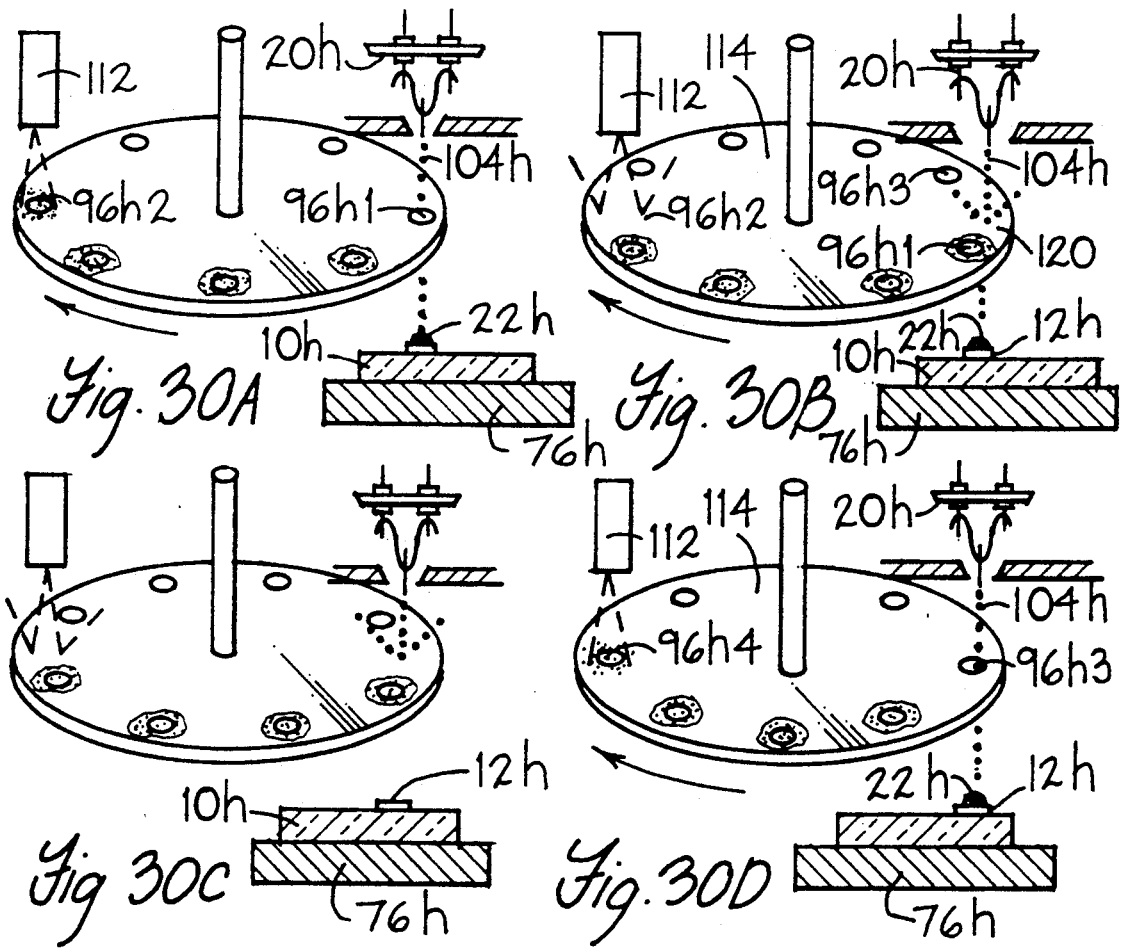
FIGS. 30A-30D are enlarged schematic isometric views partially in section illustrating the operation of the system of FIG. 29.

Referring now to FIGS. 29–30D, another embodiment of the present invention is shown which directs an ionized metal cluster beam through one focusing aperture while simultaneously ion beam etching a separate focusing aperture, wherein like elements are similarly numbered with the addition of the suffix "h" and any previous description is incorporated insofar as the same is applicable.

With reference now to FIG. 29, system 110 comprises three major parts: an ionized metal cluster beam source, a separate ion beam source for etching deposited metal, and an aperture holder movable relative to the sources so that separate apertures therethrough can simultaneously be positioned in the paths of each beam. This enables the system to provide a focused cluster beam exiting an aperture while cleaning metal out of another aperture at the same time. By way of example, system 110 includes a stationary ionized liquid metal cluster source 20h and a stationary ion source 112 such as a kaufman ion gun. Unlike system 70, sources 20h and 112 must be separate and distinct. System 110 further includes a rotatable aperture holder 114 containing a thin disk 116. Disk 116 must contain at least two apertures 96; preferably, disk 116 contains an even number of equally spaced apertures. Disk 116 is connected to axle 118 thereby allowing disk 116 to spin. Initially, aperture holder 114 is rotated so as to align one aperture, designated aperture 96h1, between cluster beam source 20h and chip 10h. Thus, source 20h is capable of depositing metal on chip 10h using aperture 96h1 to focus the beam. Concurrently, another aperture, designated aperture 96h2, located opposite (180 degrees from) aperture 96h1, is positioned beneath ion beam source 112.

Referring now to FIGS. 30A–30D, disk 116 contains eight equally spaced apertures 96h therethrough (20 micron to 100 micron diameters) uniformly mounted on the edge of the disk. Apertures 96h are thus separated by 45 degrees from one another. While eight apertures are shown for ease of illustration, the disk preferably contains more apertures, such as eighteen apertures equally spaced 20 degrees from one another. Returning to the example, in FIG. 30A source 20h deposits metal on chip 10h using aperture 96h1 to focus cluster beam 104h. At the same time, ion beam source 112 is directed at aperture 96h2 so as to etch and remove deposited metal therein. As seen in FIG. 30B, after metal bump 22h is deposited on chip 10h and aperture 96h2 is cleaned out, aperture holder 114 rotates 22.5 degrees clockwise. Further, sources 20h and 112 continue to generate their respective beams despite the movement of aperture holder 114. As a result, section 120 of aperture holder 114 centered between apertures 96h1 and 96h3 blocks cluster beam 104h and thus provides a barrier or closed shutter for chip 10h from the cluster beam. In FIG. 30C, X-Y stage 76h is repositioned to place another pad area 12h on chip 10h beneath cluster beam 104h. Thereafter, in FIG. 30D, aperture holder 114 is rotated clockwise another 22.5 degrees so that cluster beam 104h passes through a fresh aperture 96h3 and deposits metal on pad area 12h while ion source 112 begins to remove metal from partially clogged aperture 96h4. This sequence may be repeated as is necessary to assure that an unblocked aperture is available for source 20h at all times. Furthermore, aperture holder 114 can be rotated to accomodate X-Y stage 76h without causing undue delays in providing a cluster beam after the X-Y stage is repositioned. For example, with distance 102h between aperture 96h1 and chip 10h of 3 millimeters or less, the throughput of system 110 can reach $10^5$ cubic microns per second.

Numerous variations of system 110 are apparent to those skilled in the art. For instance, the operation of system 110 can be controlled by a computer which commands the operations of the X-Y stage 76h and aperture holder 114 to perform the previously described operations. Additional ion beam sources can be used to etch additional apertures not being used by the cluster beam or otherwise etched. Or additional cluster beam-/ion beam single sources (like source 20f) can be used to provide variable combinations of etch and metal deposition operations.

The present invention, therefore, is well adapted to carry out the objects and attain the ends and advantages mentioned as well as others inherent therein. While presently preferred embodiments of the invention have been described for the purpose of disclosure, numerous changes in the details of construction and steps of the process will be readily apparent to those skilled in the art and which are encompassed within the spirit of the invention and the scope of the appended claims.

What is claimed is:

1. A method of depositing electrical connection bumps on spaced pad areas of an electrical substrate and removing deposits between the bumps, said method comprising the steps of:
   depositing a metal on the pad areas by ionized metal cluster beam deposition so that metallic bumps are formed on the pad areas; and
   etching enough metal from the substrate to prevent any metal deposited outside the bumps from connecting the bumps while only partially removing the bumps.

2. The method of claim 1 wherein the metal is etched by a wet chemical etch.

3. The method of claim 1 wherein essentially all of the metal outside the bumps is removed from the substrate.

4. The method of claim 1 wherein the etching removes between one percent to ten percent of the thickness of the bumps.

5. The method of claim 1 wherein the metal is selected from the group consisting of gold, indium, lead, tin, solder, copper, nickel and aluminum.

6. The method of claim 1 wherein the ionized metal cluster beam is provided by a liquid metal source.

7. The method of claim 1, further comprising,
   depositing a layer of a metallic material over the surface of the substrate including the pad areas before depositing the metal and, after etching the metal,
   etching the exposed metallic material outside the bumps.

8. The method of claim 7 wherein the metal and the metallic material are etched in separate wet chemical etches.

9. The method of claim 8 wherein the metal is gold and the metallic material is chromium.

10. A method of depositing electrical connection bumps on spaced pad areas of an electrical substrate and removing deposits between the bumps, said method comprising the steps of:
    depositing a first metal on the pad areas by ionized metal cluster beam deposition so that first metallic bumps are formed on the pad areas;
    depositing a second metal on the first bumps so that second metallic bumps are formed on and at least partially cover the first bumps;
    etching enough second metal from the substrate to prevent any second metal outside the second bumps from connecting the second bumps while only partially removing the second bumps such that the second bumps continue to at least partially cover the first bumps, and such that any first metal deposited outside the first bumps which forms a continuous path between the first bumps is at least partially exposed; and
    etching enough first metal from the substrate to prevent any first metal deposited outside the first bumps from connecting the first bumps while at most only partially removing the first bumps.

11. The method of claim 10 wherein the second metal is not etched by the etchant used to etch the first metal so that the second bumps provide an etch mask for the first bumps.

12. The method of claim 10 wherein the second metal is etched by a wet chemical etchant.

13. The method of claim 10 wherein the first metal is etched by a wet chemical etchant.

14. The method of claim 10 wherein the second metal is deposited on the first metal by electroless plating.

15. The method of claim 10 wherein the second metal is deposited on the first metal by dipping the first bumps in a solder dip.

16. The method of claim 10 wherein the second metal is selected from the group consisting of lead, tin, nickel and gold.

17. The method of claim 10 wherein before etching the second metal the thickness of the second metal is greater than the thickness of the first metal.

18. The method of claim 10, further comprising,
    depositing a third metal on the second metal after etching the first and second metals so that third metallic bumps are formed on the second bumps.

19. The method of claim 18 wherein the second metal and the third metal are the same metal.

20. A method of depositing alloyed electrical connection bumps on spaced pad areas of an electrical substrate, said method comprising the steps of:
    depositing a first metal over the pad areas by ionized metal cluster deposition from a first source;
    depositing a second metal over the pad areas by ionized metal cluster deposition from a second source separate from the first source; and then
    alloying the deposited first and second metals, thereby forming alloyed metallic bumps on the pad areas.

21. The method of claim 20 wherein the first and second metals are deposited simultaneously.

22. The method of claim 21, further comprising,
    heating the substrate during the simultaneous deposition of the first and second metals so that metals alloy in situ.

23. The method of claim 20, further comprising,
    depositing the first metal on the pad areas,
    depositing the second metal on the first metal, and
    heating the first and second metals to form a uniform alloy.

24. The method of claim 20, further comprising,
    depositing a third metal over the pad areas by ionized metal cluster deposition from a third source separate from the first and second sources; and
    alloying the deposited first, second and third metals.

25. The method of claim 20 wherein the ionized metal cluster beams are provided by liquid metal sources.

26. The method of claim 20 wherein the first and second metals are selected from the group consisting of gold, indium, lead, tin, solder, copper, nickel and aluminum.

27. The method of claim 20 wherein the first metal is lead and the second metal is tin.

28. The method of claim 27 wherein the alloyed bumps comprise between 60 percent lead and 90 percent lead, and between 40 percent tin and 10 percent tin.

29. The method of claim 28 wherein the alloyed bumps consist of lead and tin.

* * * * *